United States Patent [19]
Cheek et al.

[11] Patent Number: 5,976,925
[45] Date of Patent: Nov. 2, 1999

[54] PROCESS OF FABRICATING A SEMICONDUCTOR DEVISE HAVING ASYMMETRICALLY-DOPED ACTIVE REGION AND GATE ELECTRODE

[75] Inventors: Jon Cheek, Round Rock; Derick J. Wristers; James F. Buller, both of Austin, all of Tex.

[73] Assignee: Advanced Micro Devices, Austin, Tex.

[21] Appl. No.: 08/980,636

[22] Filed: Dec. 1, 1997

[51] Int. Cl.⁶ .................................................. H01L 21/8238
[52] U.S. Cl. ......................... 438/231; 438/217; 438/226; 438/286; 438/300
[58] Field of Search ..................... 438/199, 217, 438/226, 231, 286, 300, FOR 168

[56] References Cited

U.S. PATENT DOCUMENTS

| | | | |
|---|---|---|---|
| 4,555,842 | 12/1985 | Levinstein et al. | 438/232 |
| 4,764,478 | 8/1988 | Hiruta | 438/585 |
| 4,912,065 | 3/1990 | Mizuno et al. | 438/301 |
| 5,168,072 | 12/1992 | Moslehi | 438/300 |
| 5,407,839 | 4/1995 | Maruo | 438/217 |
| 5,468,666 | 11/1995 | Chapman | 438/226 |
| 5,723,357 | 3/1998 | Huang | 438/199 |
| 5,744,371 | 4/1998 | Kadosh et al. | 438/286 |
| 5,851,889 | 12/1998 | Michael et al. | 438/301 |

FOREIGN PATENT DOCUMENTS

| | | |
|---|---|---|
| 60-74663 | 4/1985 | Japan . |
| 2-106043 | 4/1990 | Japan . |

*Primary Examiner*—Carl Whitehead, Jr.
*Assistant Examiner*—Khanh Duong
*Attorney, Agent, or Firm*—Merchant & Gould P.C.

[57] ABSTRACT

A semiconductor device having asymmetrically-doped gate electrode and active region and a process of fabricating such a device is provided. According to one embodiment of the invention, a polysilicon layer is formed over the substrate. The polysilicon layer is then implanted with a first dopant to form a doped polysilicon layer. Portions of the doped polysilicon layer are then removed to form at least one gate electrode. Active regions of the substrate adjacent the gate electrode are implanted with a second dopant to form source/drain regions in the substrate. In this manner, the implant used to form the source/drain regions may be decoupled from the implant used to form the gate electrode. This, for example, allows for shallower source/drain regions to be formed without the formation of the depletion layer in the gate electrode.

10 Claims, 5 Drawing Sheets

PROCESS OF FABRICATING A SEMICONDUCTOR DEVISE HAVING ASYMMETRICALLY-DOPED ACTIVE REGION AND GATE ELECTRODE

FIELD OF THE INVENTION

The present invention is directed generally to semiconductor devices and, more particularly, to a semiconductor device having asymmetrically-doped active region and gate electrode and process of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain structures 105 are formed in the semiconductor substrate 101 and are connected to source/drain terminals (not shown). The source/drain structures 105, illustrated in FIG. 1, are lightly-doped-drain (LDD) structures. Each LDD structure includes a lightly-doped, lower conductivity region 106 (hereinafter referred to as LDD region) near the channel region 107 and a heavily-doped, higher conductivity region 104 (hereinafter referred to as source/drain region) typically connected to the source/drain terminal. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain structure refers generally to an active region used for the formation of a source or drain.

A channel region 107 is formed in the semiconductor substrate 101 beneath the gate electrode 103 and separates the source/drain structure 105. The channel is typically lightly doped with a dopant of a type opposite to that of the source/drain structure 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain structure 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

One important step in the manufacture of MOS devices is the formation of the gate electrode and source/drain structures. These structures are typically formed by first depositing, usually through chemical vapor deposition (CVD), a layer of polysilicon over the entire substrate. The polysilicon layer is then patterned using a mask and etched, typically through a dry etch process, to form the gate electrode. An LDD implant is then performed to form the LDD regions 106. Spacers 108 are then formed on the gate electrode 103. Using the spacers for alignment, a source/drain implant is performed to form the source/drain regions 104 and to dope the gate electrode 103. The substrate 101 is then annealed to activate the dopants in the source/drain structures 105 as well as the dopant in the gate electrode 103.

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered. The depth of the source/drain region is an important dimension which must be scaled down as the device structure is made smaller. However, as the source/drain junction depth is reduced, complexities arise in the fabrication process.

SUMMARY OF THE INVENTION

Generally, the present invention relates to a semiconductor device having asymmetrically-doped active region and gate electrode. This, for example, allows for the formation of shallow source/drain regions without the formation of a depletion region within the gate electrode.

According to one embodiment of the invention, a polysilicon layer is formed over the substrate. The polysilicon layer is then implanted with a first dopant to form a doped polysilicon layer. Portions of the doped polysilicon layer are then removed to form at least one gate electrode. Active regions of the substrate adjacent the gate electrode are then implanted with a second dopant to form source/drain regions in the substrate. In this manner, the formation of the gate electrode and formation of the active regions may be decoupled.

In accordance with another embodiment of the invention, a process is provided for forming a semiconductor device, having a first device region of a first conductivity type and a second device region of a second conductivity type different than the first conductivity type. According to the process, a polysilicon layer is formed over a substrate. Portions of the polysilicon layer over the first device region are selectively implanted with a first dopant of a first conductivity type to form a first doped polysilicon portion. Portions of the polysilicon layer over the second device region are implanted with a second dopant of the second conductivity type to form a second doped polysilicon portion. Portions of the first and second doped polysilicon portions are then removed to form a first gate electrode in the first device region and a second gate electrode in the second device region. Source/drain regions are formed in the substrate adjacent the first gate electrode by implanting a third dopant of the first conductivity type. Source/drain regions are formed in the substrate adjacent the second gate electrode by implanting a forth dopant of the second conductivity type. The first and third dopants may be implanted deeper than the second and fourth dopants, for example.

In accordance with one aspect of the invention, the implanting of the portions of the polysilicon layer are done using the same mask patterns used while implanting the source/drain regions of the substrate adjacent the gate electrodes.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
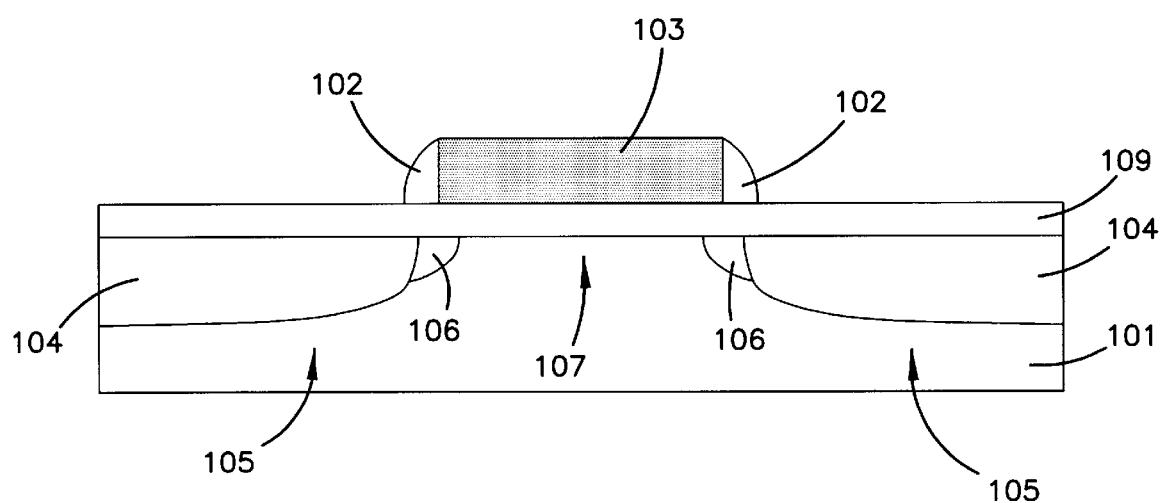
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures such as MOS, PMOS, NMOS, CMOS, and BiCMOS transistors. While the present invention is not so limited, an appreciation of various aspects of the invention will be gained through a discussion of exemplary fabrication processes and characteristics of exemplary devices in connection with the examples provided below.

Figure 2A:
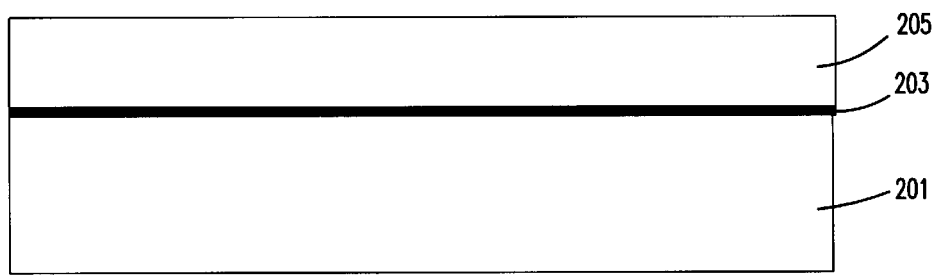
FIGS. 2A–2D illustrate a fabrication process in accordance with one embodiment of the invention.

FIGS. 2A–2D illustrate a process for fabricating a semiconductor device in which a gate electrode is doped differently than the active regions adjacent the gate electrode. In accordance with the process, a gate insulating layer 203 is formed over a substrate 201. The substrate 201 is typically formed of silicon. The gate insulating layer 203 is typically a dielectric layer, such as a silicon dioxide layer, and may be formed using, for example, well-known techniques. A layer of polysilicon 205 is formed over the gate insulating layer 203. This may be done using, for example, well-known deposition techniques. The resultant structure is illustrated in FIG. 2A.

As will be discussed further below, the polysilicon layer 205 will be used to form one or more gate electrodes on the semiconductor substrate 201. The thickness of the polysilicon layer 205 is suitably selected in consideration of the desired thicknesses of the gate electrodes. Suitable thicknesses of the polysilicon layer 205 range from 1500 to 2000 angstroms (Å) for many applications.

Figure 2B:
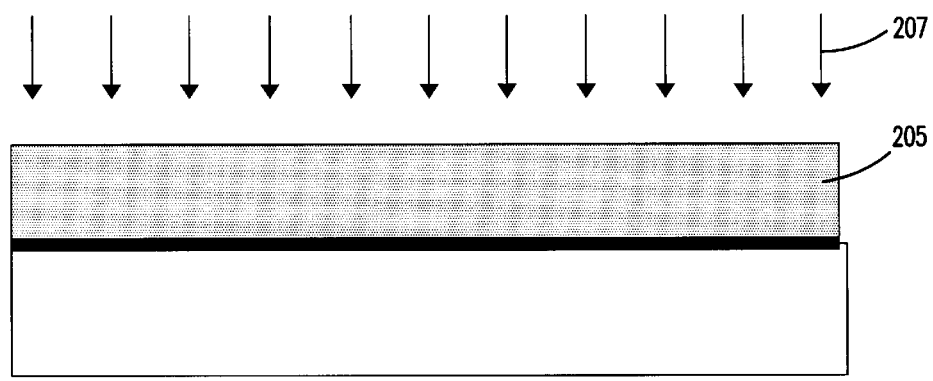

The polysilicon layer 205 is doped with a dopant 207, as illustrated in FIG. 2B. The polysilicon layer 205 may be doped by, for example, implantation or diffusion. In the example embodiment, the polysilicon layer 205 is implanted with the dopant 207. The type of dopant 207 may, for example, be a p-type dopant such as boron (e.g., $B^{11}$ or $BF_2$) or an n-type dopant such as arsenic (As) or phosphorus (P). Typically, a p-type dopant is used with PMOS devices and an n-type dopant is used for an NMOS device. However the invention is not so limited.

The implant energies and dopant concentrations are selected in consideration of the desired conductivity characteristics of the polysilicon layer 205, taking into account subsequent heat treatment of the semiconductor device as well as any subsequent implants into the polysilicon layer 205 (e.g. when forming source/drain regions). Typically, the dopant 207 is provided to a sufficient depth such that when activated (and diffused) by subsequent heat treatment, the dopant 207 extends down to the base of the polysilicon layer next to the insulating layer 203. This prevents the formation of a depletion layer at the base of the gate electrode.

Suitable implant energies and dopant dosages for an As or P dopant 207 range from about 50 to 60 KeV and 2E15 to 4E15 atoms/cm², respectively, for many applications. For a $BF_2$ dopant 207, suitable energy levels and dopant dosages range from about 50 to 60 KeV and 2E15 to 4E15 atoms/cm², respectively, for many applications. Suitable implant energies and dopant dosages for a $B^{11}$ dopant 207 range from about 10 to 15 KeV and 2E15 to 4E15 atoms/cm², respectively, for many applications.

Following the doping of the polysilicon layer 205, the wafer may be heated to activate the dopant 207 within the polysilicon layer 205. The heat treatment may be done using, for example, well-known rapid thermal anneal (RTA) techniques. This heat treatment is typically performed when using an n-type dopant. When using a p-type dopant such as boron which diffuses more rapidly than most n-type dopants, this heat treatment is typically omitted and the polysilicon layer 205 is activated during the activation of the dopants used to form source/drain regions as will be discussed further below.

After the polysilicon layer 205 has been doped, portions of the polysilicon layer 205 are removed to form one or more gate electrodes (only one of which is shown). Portions of the polysilicon layer 205 may be removed using, for example, well-known photolithography and etching techniques. Portions of the semiconducto substrate 201 which lie adjacent the gate electrode 209 generally define active regions 215 of the substrate 201. As used herein, the term active region encompasses a region where an active portion of the device resides whether the active portion has been or will be formed.

Figure 2C:
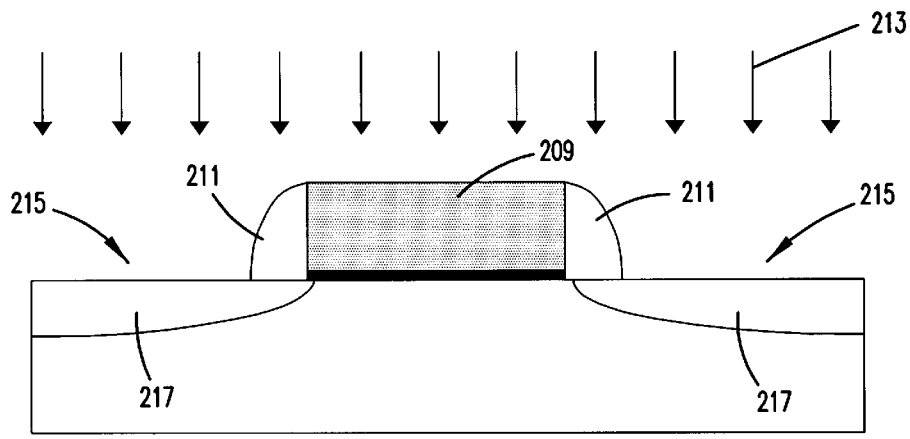

Source/drain regions 217 are formed in the substrate 201 by doping the active regions 215 with a dopant. The source/drain regions 217 may, for example be formed by implantation or diffusion. In the example embodiment, on sidewalls of the gate electrode 209, spacers 211 are formed. The spacers 211 will be used to space a source/drain implant from the channel region below the gate electrode 209. The spacers 211 may be formed using, for example, well-known techniques. After the spacers 211 are formed, a dopant 213 is implanted into the active regions 215 adjacent the gate electrode 209 to form the source/drain regions 217. The dopant 213 is also typically implanted into the gate electrode 209. The wafer is then typically heated to activate the dopant 213 in the active regions 215. The heat treatment may be performed using, for example, well-known RTA techniques. The resultant structure is illustrated in FIG. 2C.

The dopant 213 is typically the same as the dopant 207. The implant energies and dopant dosage of dopant 213 are suitably selected in consideration of the desired profile of the source/drain regions. Since the gate electrode received sufficient doping earlier, the profile of the source/drain regions 217 may be tailored independent of the gate electrode. For example, the dopant 213 may be implanted to a shallower depth than the dopant 207 used to dope the gate electrode.

Suitable implant energies and dosages of the dopant 213 implant range from about 20 to 40 KeV and 2E15 to 4E15 atoms/cm$^2$, respectively, for many applications involving p-type or n-type dopants.

Figure 2D:
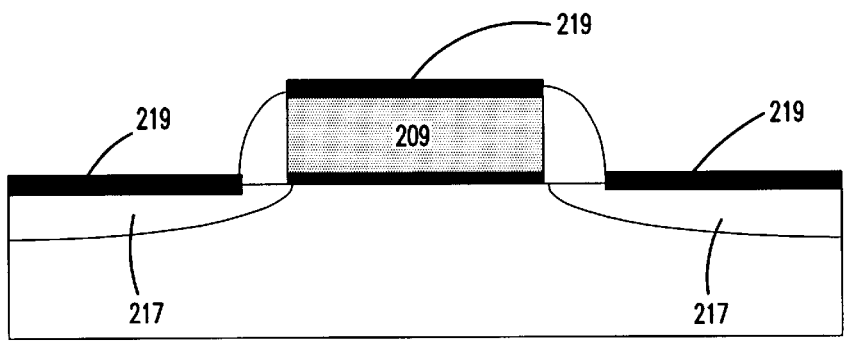

A silicide layer 219 is typically formed over the source/drain regions 217 and the gate electrode 209, as illustrated in FIG. 2D. This may be down using, for example, well-known silicidation techniques. Fabrication of the device may continue with well-known processing steps, such as contact formation, interconnect formation, and so forth to form the ultimate device structure.

Using the above process, a gate electrode may be doped differently than adjacent source/drain regions. In particular, the gate electrode may be implanted with a dopant to a depth greater than the depth of the dopant used to form the source/drain regions. This allows for the formation of shallow source/drain regions without the formation of a depletion layer at the base of the gate electrode. For example, source/drain regions having junction depths less than the depth or thickness of the gate electrode may be formed while still fully doping the gate electrode (i.e., incorporating dopant at the base of the gate electrode). This increases device performance by, for example, allowing enhanced gate control and increasing the speed of the device.

The above process can be used to form a number of different semiconductor devices including but not limited to, MOS structures such as p-type MOS devices (PMOS), n-type MOS devices (NMOS), and complementary MOS (CMOS) semiconductor devices having both PMOS and NMOS devices. Moreover, the above process can be used to form lightly doped drain (LDD) structures. FIGS. 3A–3H illustrate another embodiment of the invention in which gate electrodes of different channel types of a semiconductor device, such as a CMOS device, are doped differently than adjacent active regions. This embodiment also illustrates an exemplary process of forming LDD source/drain structures.

Using known techniques, NMOS device regions and PMOS device regions are defined on a substrate 301 (only one NMOS device region and one PMOS device region are illustrated). The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrode.

Figure 3A:
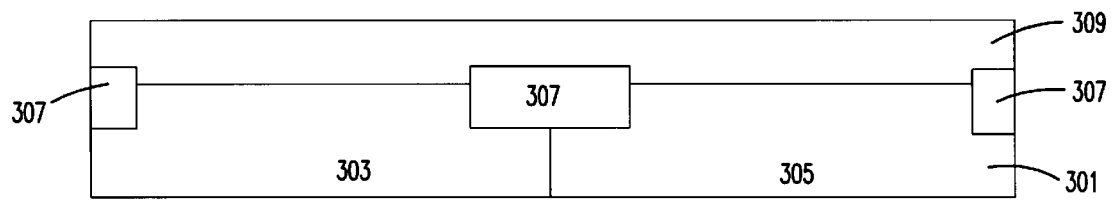
FIGS. 3A–3H illustrate another fabrication process in accordance with another embodiment of the invention.

Field oxide regions 307 are typically formed to isolate adjacent device regions. A polysilicon layer 309 is formed over the substrate 301. The polysilicon layer 309 may be formed using, for example, well-known deposition techniques. The polysilicon layer 309 will be used to form a gate electrode in the NMOS device region 303 and a gate electrode in the PMOS device region 305. The thickness of the polysilicon layer 309 is suitably selected in consideration of the desired thicknesses of the gate electrodes. Suitable thicknesses of the polysilicon layer 309 range from about 1500 to 2000 angstroms for many applications. While not shown, the polysilicon layer 309 is typically insulated from the substrate 301 using a gate insulating layer, such as a silicon dioxide layer. The resultant structure is illustrated in FIG. 3A.

After the polysilicon layer 309 has been formed, a mask 311 is formed over the substrate 301 to cover the PMOS device region 305 and expose a portion 309a of the polysilicon layer 309 in the NMOS device region 303. The masking layer 311 may, for example, be formed using well-known photolithography techniques. These techniques generally include forming the masking layer 311 over the entire substrate 301, patterning the masking layer 311 with a mask pattern (typically defined in a reticle or mask depending on the photolithography process used), and developing the masking layer 311 to selectively remove portions of the masking layer 311. Advantageously, the mask pattern used to pattern the masking layer 311 may be the same mask pattern (e.g., identical mask or reticle or a reticle or mask having an identical pattern) used to form the source/drain regions in the NMOS device region 303, as will be discussed further below.

Figure 3B:
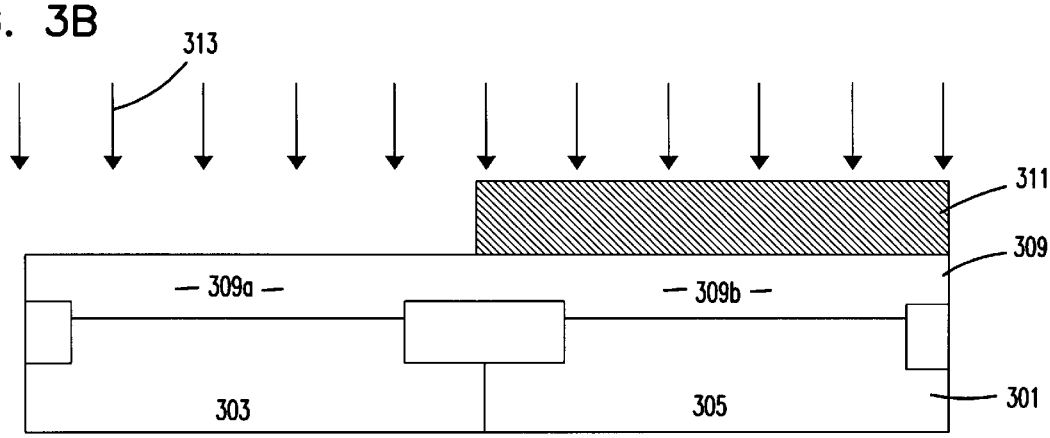

The exposed portion 309a of the polysilicon layer 309 is then implanted with a dopant 313. The implant energy and dosage of the dopant 313 are selected in consideration of the desired conductivity characteristics of the polysilicon layer 309, taking into account subsequent heat treatment of the semiconductor device as well as any subsequent implants into the polysilicon layer 205 (e.g., when forming source/drain regions). The dopant 313 is typically implanted to a sufficient depth such that, initially and/or during subsequent heat treatment steps, the dopant will extend to the base of the polysilicon layer 309 (e.g., the polysilicon layer 309-gate insulating layer interface). The dopant 313 is typically an n-type dopant such as arsenic or phosphorus. Suitable implant energies for an As or P n-type dopant 313 range from about 50 to 60 KeV, while suitable dopant dosages range from about 2E15 to 4E15 atoms/cm$^2$ for many applications. The resultant structure is illustrated in FIG. 3B.

After the polysilicon layer portion 309a has been implanted with the dopant 313, the wafer may be heated to activate the n-type dopants in the polysilicon layer portion 309a. This may be done using, for example, well-known RTA techniques. In one particular embodiment, the substrate 301 is annealed at a temperature of about 1035° C. to 1065° C. for about 20 to 40 seconds.

Figure 3C:
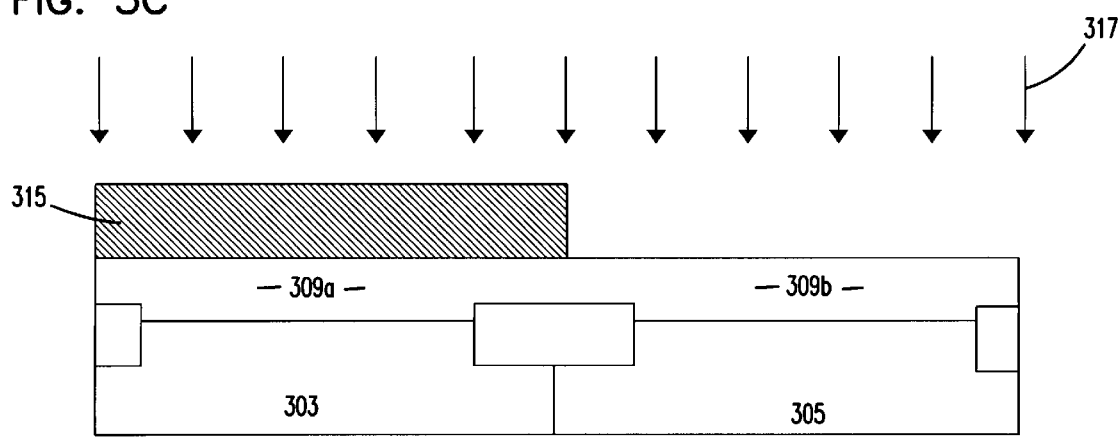

The masking layer 311 is removed and another masking layer 315 is formed to cover the NMOS portion 309a of the polysilicon layer 309 and expose the PMOS portion 309b of the polysilicon layer 309. The masking layer 315 may, for example, be formed using well-known photolithography techniques. As noted above, these techniques typically employ a mask pattern to pattern the masking layer 315. As will be discussed further below, the mask pattern used to form the masking layer 315 may be the same as that used to mask the NMOS device region 303 during the formation of source/drain regions in the PMOS device region 305. The exposed portion 309b of the polysilicon layer 309 is then implanted with a dopant 317. The resultant structure is illustrated in FIG. 3C.

The dopant 317 is typically a p-type dopant such as a boron-containing species (e.g., $BF_2$ or $B^{11}$). The implant energies and dopant concentrations are selected in consideration of the desired conductivity characteristics of the polysilicon layer 309, taking into account subsequent heat treatment of the semiconductor device as well as any subsequent implants into the polysilicon layer 309 (e.g., when forming source/drain regions). The p-type dopant 317 is typically implanted to a suitable depth to allow the p-type dopant to extend to the base of the PMOS portion 309b of the polysilicon layer 309. This prevents the formation of a depletion layer near the base of the polysilicon layer 309. Suitable implantation energies and dopant dosages range from about 50 to 60 KeV and 2E15 to 4E15 atoms/cm$^2$, respectively, for many applications using a $BF_2$ dopant. For applications using a $B^{11}$ dopant, a comparable dosage is employed with a lower energy level (e.g., about 10 to 15 KeV).

The masking layer 315 is then removed, and portions of the polysilicon layer 309 are selectively removed to form gate electrodes (only two of which are shown). The masking layer 315 may be removed using, for example, well-known techniques. Selective removal of the polysilicon layer 309 to form the gate electrodes 317a and 317b may be done using, for example, well-known photolithography and etching techniques.

Figure 3D:
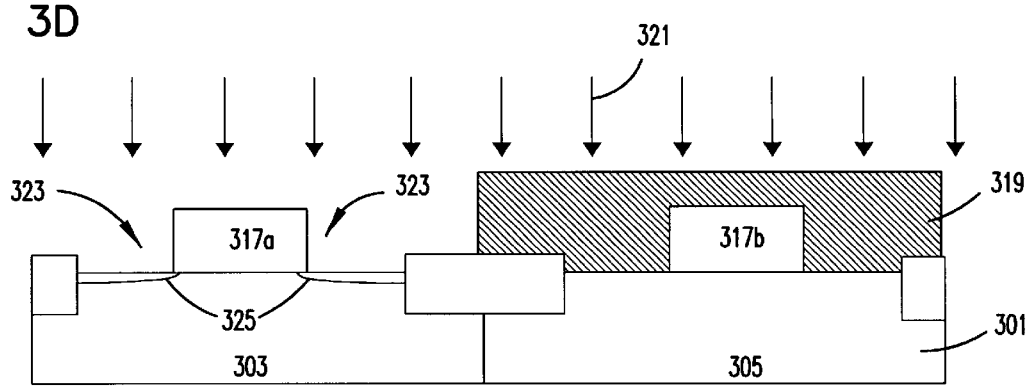

A masking layer 319 is then formed over the substrate 301 to cover the PMOS device region 305 and expose the NMOS device region 303. The masking layer 319 may, for example, be formed using well-known photolithography techniques. In particular, the masking layer 319 may be formed using the same mask pattern used to pattern masking layer 311 above. With the masking layer 319 in place, an n-type dopant 321 (e.g., As or P) is implanted into the active regions 323 in the NMOS device region 303 in order to form LDD regions 325 in the active regions 323. The resultant structure is illustrated in FIG. 3D. As will be discussed below, the LDD regions 325 will be used to form LDD source/drain structures. Suitable implant energies and dopant dosages for an As dopant 321 range from about 5 to 15 KeV and 5E14 to 3E15 atoms/cm$^2$, respectively, for many applications.

Figure 3E:
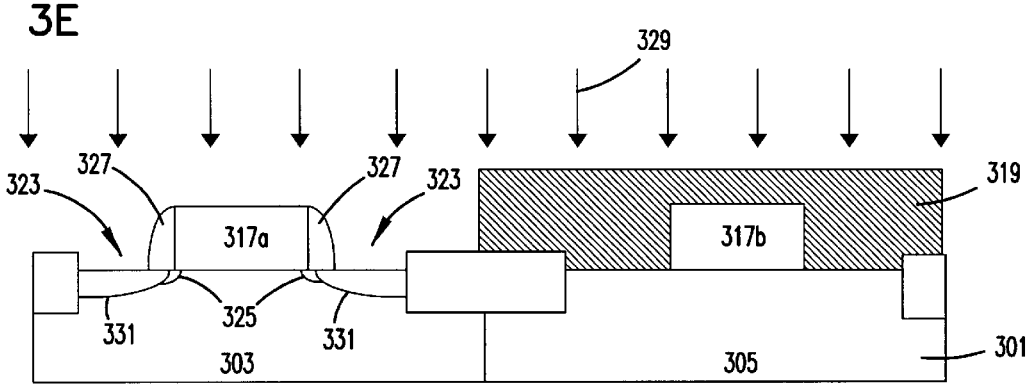

Spacers 327 are formed on sidewalls of the gate electrode 317a using, for example, well-known techniques. Using the spacers 327 for alignment, a dopant 329 is implanted into the active regions 323 of the NMOS device region 303 to form source/drain regions 331 in the active regions 323. The resultant structure is illustrated in FIG. 3E. Together the source/drain regions 331 and LDD regions 325 are used to form LDD source/drain structures.

The dopant 329 is typically an n-type dopant (e.g., As or P). The dosage and implant energy of the dopant 329 are suitably selected in consideration of the desired profile (e.g., conductivity and depth) of the source/drain regions 331. Since the gate electrode 317a was sufficiently doped earlier, the profile of the source/drain regions may be tailored without taking into account doping of the gate electrode. For example, the dopant 329 may be implanted to shallower depths than the dopant 313 used to dope the gate electrode. Suitable implant energies and dopant dosages for an As dopant 329 range from 20 to 40 KeV and 2E15 to 4E15 atoms/cm$^2$, respectively, for many applications.

Following the implant of dopant 329, the wafer is typically heated to activate the dopants 321 and 329 in the low and high conductivity regions 325 and 331 respectively. Typically, the heat treatment also simultaneously activates the dopant 317 in the gate electrode 317b. The heat treatment may be performed using, for example, an RTA process. In one example embodiment, the wafer is rapid thermal annealed at a temperature ranging from about 1000 to 1050° C. for about 20 to 40 seconds.

Figure 3F:
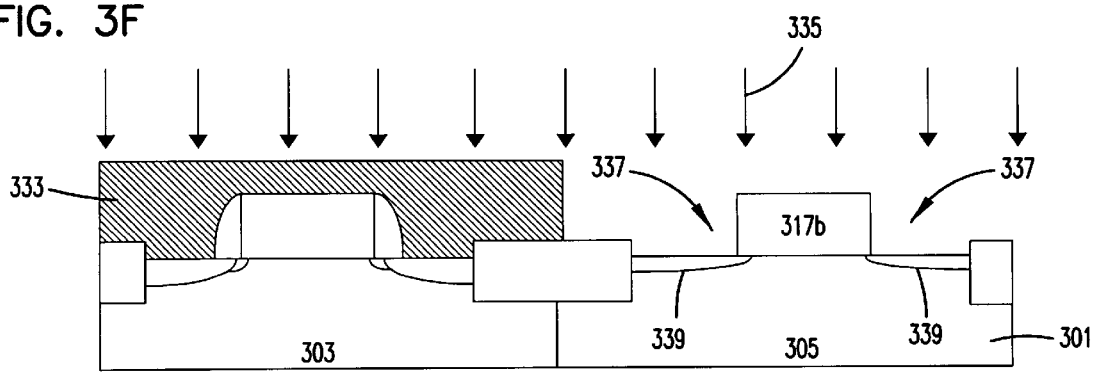

The masking layer 319 is removed and another masking layer 333 is formed over the substrate 301 to cover the NMOS device region 303 and expose the PMOS device region 305. The masking layer 333 may, for example, be formed using well-known photolithography techniques. In particular, the masking layer 333 may be formed using the same mask pattern used to pattern masking layer 315 above. With the masking layer 333 in place and using the gate electrode 317b for alignment, a p-type dopant 335 (e.g., $B^{11}$ or $BF_2$) is implanted into the active regions 337 of the PMOS device region 305 in order to form LDD regions 339 in the active regions 337. The resultant structure is illustrated in FIG. 3F. The dosage and implant energy of the dopant 335 are suitably selected in consideration of the desired conductivity and depth of the LDD regions 339. Suitable implant energies and dopant dosages for a $BF_2$ dopant 335 range from about 5 to 15 KeV and 5E14 to 3E15 atoms/cm$^2$, respectively, for many applications.

Figure 3G:
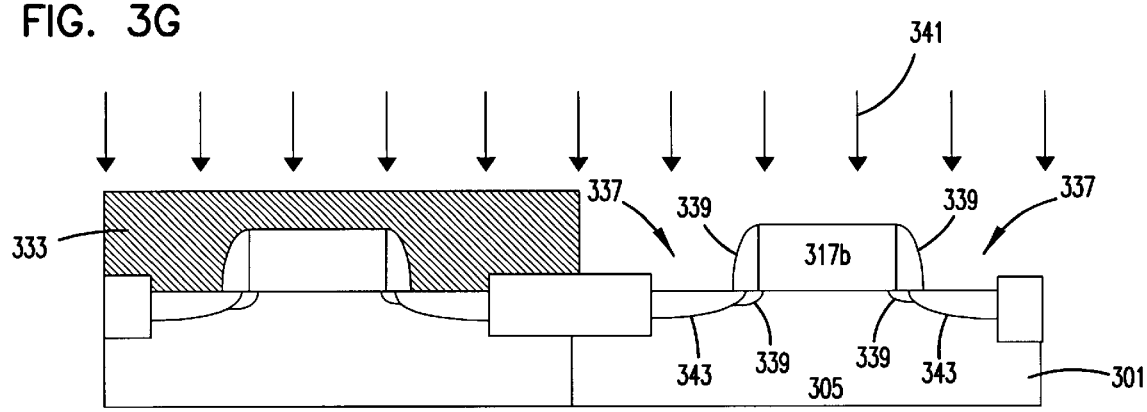

Spacers 339 are formed on sidewalls of the gate electrode 317b and are used to align a high dose implant of a p-type dopant 341 into the active regions 337 of the PMOS device region 305. The spacers 339 may be formed using, for example, well-known techniques. The p-type dopant 341 (e.g., $B^{11}$ or $BF_2$) is implanted into the substrate 301 to form a source/drain region 343 in each PMOS active region 337. The resultant structure is illustrated in FIG. 3G. Together the source/drain regions 343 and LDD regions 339 are used to form p-type LDD source/drain structures.

The dopant dosages and energy level of the dopant 341 implant are suitably selected in consideration of the desired profile of the source/drain regions 343. Again, the energy level and dosage of the dopant 341 may also be selected without taking into account doping of the gate electrode 317b. For example, the dopant 341 may be implanted to a shallower depth than dopant 317 used to dope the PMOS gate electrode. Suitable implant energies and dopant dosages for a $BF_2$ dopant 341 range from about 20 to 40 KeV and 2E15 to 4E15 atoms/cm$^2$, respectively, for many applications.

Following the source/drain implant of dopant 341, the wafer is heated in order to activate the dopants 335 and 341 in the source/drain and LDD regions 343 and 339, respectively. The heat treatment is typically performed using an RTA process. In one particular embodiment, an RTA process is used in which the temperature is ramped to 150 to 1020° C. for 20 to 40 seconds.

Figure 3H:
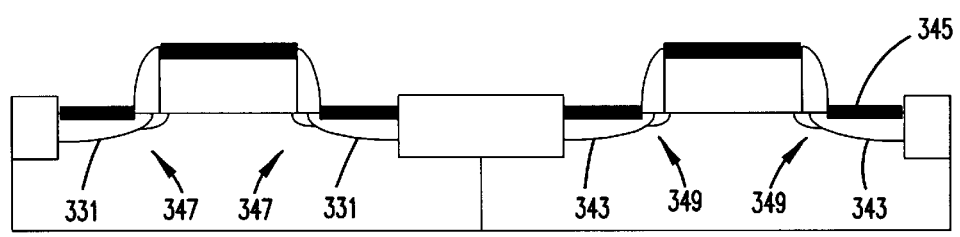

The masking layer 333 is removed and fabrication of the device continues with well-known process steps, such as silicidation, contact formation, and interconnect formation. The resultant structure after the formation of a silicidation layer 345 is illustrated in FIG. 3H. The resultant structure generally includes NMOS and PMOS LDD source/drain structures 347 and 349 having source/drain regions 331 and 343 which have been doped differently than their respective gate electrodes. In particular, the LDD source/drain structures 347 and 349 may each have source/drain junction depths which are shallower than the depth/thickness of the respective gate electrode, while at the same time the gate electrode may include dopant throughout its entire depth.

Using the above process, formation of gate electrodes and source/drain regions of a CMOS device can be decoupled. This, for example, allows for the formation of shallow source/drain regions without the formation of a depletion regions near the base of the gate electrodes. For example, source/drain regions having junction depths less than the depth or thickness of the gate electrode may be formed while still fully doping the gate electrode (i.e., incorporating dopant at the base of the gate electrode). This increases device performance by, for example, reducing the capacitance between the gate electrode and the substrate and increasing the speed of the device.

As noted above, the present invention is applicable to the fabrication of a number of different devices where the advantage of asymmetrical doping of a gate electrode and an adjacent active region is desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of fabricating a semiconductor device having at least one first device region of a first conductivity type and at least one second device region of a second conductivity type opposite the first conductivity type, comprising:

forming a polysilicon layer over a substrate;

selectively implanting portions of the polysilicon layer over the first device region with a first dopant of the first conductivity type to form a first doped polysilicon portion;

selectively implanting portions of the polysilicon layer over the second device region with a second dopant of the second conductivity type to form a second doped polysilicon portion;

removing portions of the first and second doped polysilicon portions to form a first gate electrode in the first device region and a second gate electrode in the second device region;

selectively implanting active regions of the substrate adjacent the first gate electrode with a third dopant of the first conductivity type to form first source/drain regions; and selectively implanting active regions of the substrate adjacent the second gate electrode with a fourth dopant of the second conductivity type to form second source/drain regions;

further including heating the substrate to activate the second dopant and third dopant after implanting the active regions of the substrate adjacent the first gate electrode and before implanting the active regions of the substrate adjacent the second gate electrode;

wherein the first dopant is implanted deeper than the third dopant and the second dopant is implanted deeper than the fourth dopant.

2. The process of claim 1, further including heating the substrate to activate the first dopant after selectively implanting portions of the polysilicon layer over the first device region and before selectively implanting portions of the polysilicon layer over the second device region.

3. The process of claim 1, the first conductivity type is n-type and the second conductivity type is p-type.

4. The process of claim 1, wherein selectively implanting portions of the polysilicon layer over the first device region includes using a mask pattern to selectively expose the portions of the polysilicon layer over the first device region and implanting active regions of the substrate adjacent the first gate electrode includes using the same mask pattern.

5. The process of claim 1, wherein selectively implanting portions of the polysilicon layer over the second device region includes using a mask pattern to selectively expose the portions of the polysilicon layer over the second device region and implanting active regions of the substrate adjacent the second gate electrode includes using the same mask pattern.

6. The process of claim 1, wherein the first dopant is implanted at a higher energy level than the third dopant and the second dopant is implanted at a higher energy level than the fourth dopant.

7. A process of fabricating a CMOS device having at least one NMOS device region and at least one PMOS device region, comprising:

forming a polysilicon layer over a substrate;

selectively implanting portions of the polysilicon layer over the NMOS device region with a first n-type dopant to a first depth;

heating the substrate to activate the first n-type dopant within the polysilicon layer;

after heating to activate the first n-type dopant, selectively implanting portions of the polysilicon layer over the PMOS device region with a first p-type dopant to a second depth;

removing portions of the doped polysilicon layer to form an NMOS gate electrode in the NMOS device region and a PMOS gate electrode in the PMOS device region;

forming NMOS source/drain regions adjacent the NMOS gate electrode by implanting the substrate with a second n-type dopant to a third depth shallower than the first depth, wherein the selectively implanting portions of the polysilicon layer over the PMOS device region, removing portions of the doped polysilicon layer to form an NMOS gate electrode in the NMOS device region and a PMOS gate electrode in the PMOS device region, and forming NMOS source/drain regions adjacent the NMOS gate electrode by implanting the substrate with a second n-type dopant are performed without activating the first p-type dopant within the polysilicon layer and without activating the second n-type dopant in the NMOS source/drain regions;

after forming the NMOS source/drain regions adjacent the NMOS gate electrode by implanting the substrate with a second n-type dopant heating the substrate to activate the first p-type dopant within the polysilicon layer and to activate the second n-type dopant in the NMOS source/drain regions; and forming PMOS source/drain regions adjacent the PMOS gate electrode by implanting the substrate with a second p-type dopant to a fourth depth shallower than the second depth.

8. The process of claim 7, further including heating the substrate to activate the second p-type dopant in the PMOS source/drain regions.

9. The process of claim 7, wherein selectively implanting portions of the polysilicon layer over the NMOS device region includes using a mask pattern to selectively expose the portions of the polysilicon layer over the NMOS device region and form the NMOS source/drain regions of the substrate includes using the same mask pattern.

10. The process of claim 7, wherein selectively implanting portions of the polysilicon layer over the PMOS device region includes using a mask pattern to selectively expose the portions of the polysilicon layer over the PMOS device region and form the PMOS source/drain regions of the substrate includes using the same mask pattern.

* * * * *

UNITED STATES PATENT AND TRADEMARK OFFICE
CERTIFICATE OF CORRECTION

PATENT NO. : 5,976,925

DATED : November 2, 1999

INVENTOR(S) : Cheek et al.

It is certified that error appears in the above-indentified patent and that said Letters Patent is hereby corrected as shown below:

The title should read "PROCESS OF FABRICATING A SEMICONDUCTOR DEVICE HAVING ASYMMETRICALLY-DOPED ACTIVE REGION AND GATE ELECTRODE".

Signed and Sealed this

Seventeenth Day of April, 2001

Attest:

NICHOLAS P. GODICI

Attesting Officer     Acting Director of the United States Patent and Trademark Office